United States Patent
Choi

(10) Patent No.: US 7,674,711 B2
(45) Date of Patent: Mar. 9, 2010

(54) METHOD OF FABRICATING FLASH MEMORY DEVICE BY FORMING A DRAIN CONTACT PLUG WITHIN A CONTACT HOLE BELOW AND ILD INTERFACE

(75) Inventor: Yun Je Choi, Seoul (KR)

(73) Assignee: Hynix Semiconductor, Inc., Icheon-si (KR)

( * ) Notice: Subject to any disclaimer, the term of this patent is extended or adjusted under 35 U.S.C. 154(b) by 75 days.

(21) Appl. No.: 11/951,764

(22) Filed: Dec. 6, 2007

(65) Prior Publication Data

US 2009/0004854 A1    Jan. 1, 2009

(30) Foreign Application Priority Data

Jun. 29, 2007    (KR)    ............... 10-2007-0065041

(51) Int. Cl.
  *H01L 21/28* (2006.01)
  *H01L 21/44* (2006.01)
  *H01L 21/768* (2006.01)
(52) U.S. Cl. ............................. 438/667; 257/E21.597
(58) Field of Classification Search ............. 438/667; 257/E21.597
  See application file for complete search history.

(56) References Cited

U.S. PATENT DOCUMENTS

2004/0065959 A1*  4/2004  Park ...................... 257/758

FOREIGN PATENT DOCUMENTS

KR  10-2004-0059935  7/2004
KR  10-0628244  9/2006

\* cited by examiner

*Primary Examiner*—Matthew Smith
*Assistant Examiner*—Walter H Swanson
(74) *Attorney, Agent, or Firm*—Marshall, Gerstein & Borun LLP

(57) ABSTRACT

The present invention relates to a method of fabricating a flash memory device. The method may include forming a first and a second interlayer insulating film on a semiconductor substrate having a cell region, etching the second and first interlayer insulating films, thus forming a contact hole through which a junction region of the cell region is exposed, forming a contact plug within the contact hole, the contact plug having a height lower than that of an interface of the first and second interlayer insulating films, and forming a spacer on sidewalls of the contact hole over the contact plug.

13 Claims, 3 Drawing Sheets

METHOD OF FABRICATING FLASH MEMORY DEVICE BY FORMING A DRAIN CONTACT PLUG WITHIN A CONTACT HOLE BELOW AND ILD INTERFACE

CROSS-REFERENCES TO RELATED APPLICATIONS

Priority is claimed to Korean patent application number 10-2007-65041 filed on Jun. 29, 2007, the disclosure of which is incorporated by reference in its entirety.

FIELD OF THE INVENTION

The present invention relates to a method of fabricating a flash memory device and, more particularly, to a method of fabricating a flash memory device that can prevent bit line failure by preventing a bridge between contact plugs.

BACKGROUND OF THE INVENTION

A cell array of a NAND flash device includes a plurality of cell blocks. Each cell block is operated with a cell array divided into strings, unlike a common flash device. Due to this characteristic, a drain contact connected to a bit line and a source contact for global ground are positioned at both ends of the string. These contacts are connected to the junction of a select transistor for string control.

A process of forming a source contact plug and a drain contact plug of a general flash device is described in short. A plurality of string structures are formed on a semiconductor substrate, including a source select transistor, a plurality of memory cells, and a drain select transistor. A first interlayer insulating film is formed on the string structures. A first contact hole through which the source of the source select transistor is exposed is then formed. A barrier metal layer (Ti/TiN) and a tungsten (W) layer are laminated over the first interlayer insulating film including the first contact hole. A Chemical Mechanical Polishing (CMP) process is then performed to form a source contact plug that gap fills the first contact hole. After a second interlayer insulating film is formed on the source contact plug, a second contact hole through which the drain of the drain select transistor is exposed is formed. A polysilicon film is then deposited on the second interlayer insulating film including the second contact hole. A CMP process is then performed to form a drain contact plug that gap fills the second contact hole.

However, in the process of forming the source contact plug using the CMP process, residues of the barrier metal layer or the tungsten (W) layer remain on the first interlayer insulating film. If the region on which the conductive residues remain is a region where the drain contact plug is formed, neighboring drain contact plugs are interconnected by the conductive residues, so a bridge is generated. A bridge between the drain contact plugs is also generated due to abnormal oxidization of tungsten (W) of the conductive residues. In this case, the bridge causes the bit line leakage current, resulting in a low yield.

Furthermore, at the time of a wet etch process for forming the drain contact hole, etch damage causes an open path to be generated at the interface of the first interlayer insulating film and the second interlayer insulating film. In this case, when depositing the polysilicon film on the contact hole, neighboring drain contact plugs are interconnected through the open path, thus generating a bridge and bit line failure.

BRIEF SUMMARY OF THE INVENTION

In an embodiment of the present invention, a method of fabricating a flash memory device may include forming a first and a second interlayer insulating films on a semiconductor substrate having a cell region, etching the second and first interlayer insulating films, thus forming a contact hole through which a junction region of the cell region is exposed, forming a contact plug within the contact hole, the contact plug having a height lower than that of an interface of the first and second interlayer insulating films, and forming a spacer on sidewalls of the contact hole over the contact plug.

In an embodiment of the present invention, the formation of the contact plug may include forming a conductive film on the second interlayer insulating film, including the contact hole, so that the contact hole is gap filled, etching the conductive film until the second interlayer insulating film is exposed, and etching the conductive film so that the conductive film is lower than the interface of the first and second interlayer insulating films.

In an embodiment of the present invention, at the time of etching the conductive film, a target etch thickness may be set thicker than a thickness of the second interlayer insulating film, so that the conductive film becomes lower than the interface of the first and second interlayer insulating films. The second interlayer insulating film may be formed to a thickness of approximately 2000 to 3000 angstroms. The etch process may be performed with the target etch thickness of approximately 3100 to 4000 angstroms using, for example, a fluorine (F)-based gas, such as sulfur hexafluoride ($SF_6$), nitrogen trifluroride ($NF_3$), or carbon tetrafluoride ($CF_4$), and chlorine ($Cl_2$) gas in a dry etch equipment of a High Density Plasma (HDP) method.

In an embodiment of the present invention, the spacer may be formed to a thickness of approximately 50 to 130 angstroms, using, for example, a nitride film or an oxide film. Further, the spacer may be formed using, for example, an anisotropic etch process in a dry etch equipment of a Capacitively Coupled Plasma (CCP) type.

DESCRIPTION OF SPECIFIC EMBODIMENTS

Several embodiments according to the present invention will be described with reference to the accompanying drawings. These embodiments are used for illustrative purposes, the invention is not limited thereto.

Figure 1A:
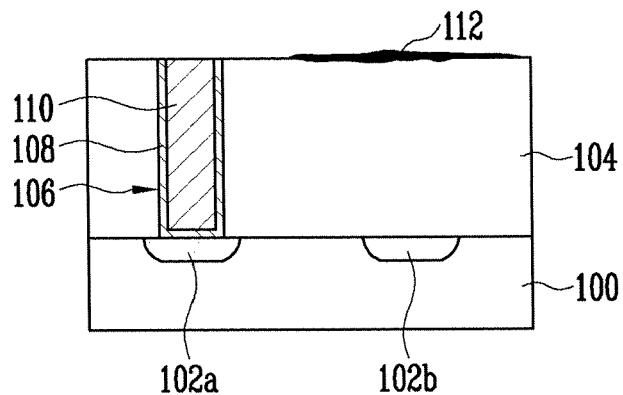
FIGS. 1A to 1G are sectional views illustrating a method of fabricating a flash memory device according to an embodiment of the present invention.

Referring to FIG. 1A, a plurality of string structures may be formed in a cell region of a semiconductor substrate 100 (only a source 102a of a source select transistor and a drain 102b of a drain select transistor are shown). The string structures may include, for example, a source select transistor, a plurality of memory cells, and a drain select transistor. A source contact plug 110 may be formed over the source 102a of the source select transistor.

A first interlayer insulating film 104 may be formed on a semiconductor substrate 100 that may include, for example, the source select transistor, the drain select transistor, and a plurality of memory cells. A first contact hole 106 through which the source 102a of the source select transistor is exposed may then be formed. In this example, the first contact hole 106 becomes a source contact hole. A barrier metal layer 108, such as a stack film of Ti/TiN, for example, may be formed on the first interlayer insulating film 104 including the first contact hole 106. A tungsten (W) layer (not shown) may be stacked on the barrier metal layer 108 in such a way to gap fill the first contact hole 106. A CMP process, for example, may be performed until the surface of the first interlayer insulating film 104 is exposed, thus forming the source contact plug 110 that gap fills the first contact hole 106.

However, in the process of forming the source contact plug 110 using the CMP process, conductive residues of the barrier metal layer 108 or the tungsten (W) layer remain on the first interlayer insulating film 104 as a conductive residue layer 112.

Figure 1B:
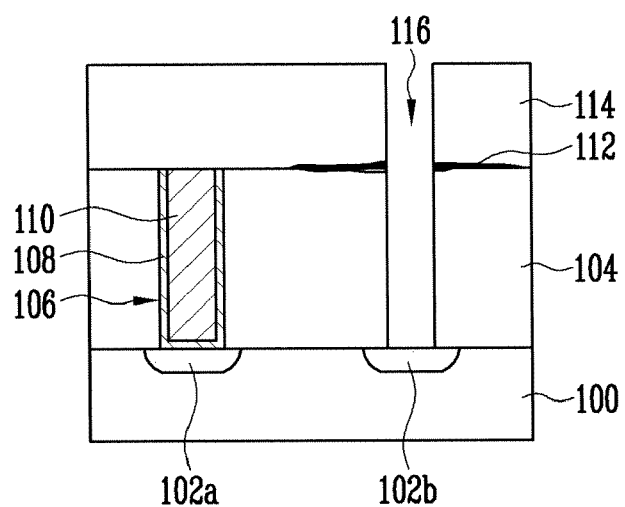

Referring to FIG. 1B, a second interlayer insulating film 114 may be formed over the first interlayer insulating film 104, including the source contact plug 110 and the conductive residue layer 112. The second interlayer insulating film 114 may be formed using, for example, oxide-base materials. For example, Spin On Glass (SOG), Boron to Phosphorus Silicate Glass (BPSG), Plasma Enhanced Tetra Ethyl Ortho Silicate (PETEOS), Undoped Silicate Glass (USG), or Phosphorus Silicate Glass (PSG) can be used to form the second interlayer insulating film 114. At this time, the second interlayer insulating film 114 may have a thickness of approximately 2000 to 3000 angstroms.

Some regions of the second interlayer insulating film 114 and the first interlayer insulating film 104 may be etched, for example, by an etch process employing a mask (not shown) to form a second contact hole 116. A junction region, for example, the drain region 102b, may be exposed through the second contact hole 116. In this example, the second contact hole 116 becomes a drain contact hole. On the other hand, in the etch process of the second and first interlayer insulating films 114 and 104, the conductive residue layer 112 remaining at the interface of the first interlayer insulating film 104 and the second interlayer insulating film 114 is also etched.

Though not shown in the drawing, when the second contact hole 116 is formed, an open path may be formed at the interface of the first interlayer insulating film 104 and the second interlayer insulating film 114 due to etch damage.

Figure 1C:
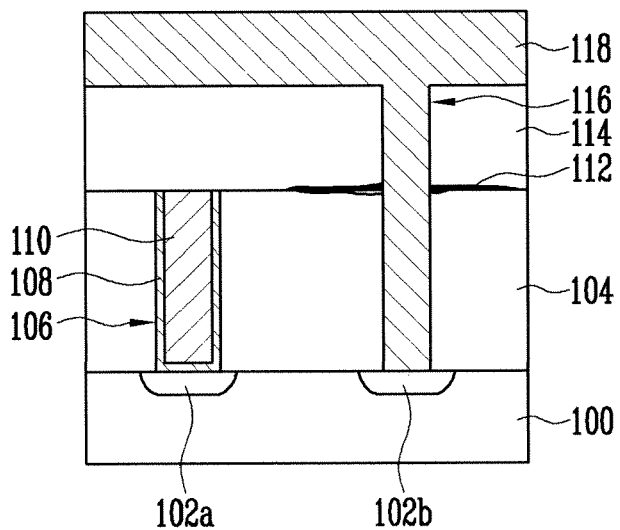

Referring to FIG. 1C, a conductive material may be deposited on the second interlayer insulating film 114, including the second contact hole 116 so that the second contact hole 116 is gap filled and a conductive film 118 is formed. The conductive film 118 may be formed using, for example, a polysilicon film.

Figure 1D:
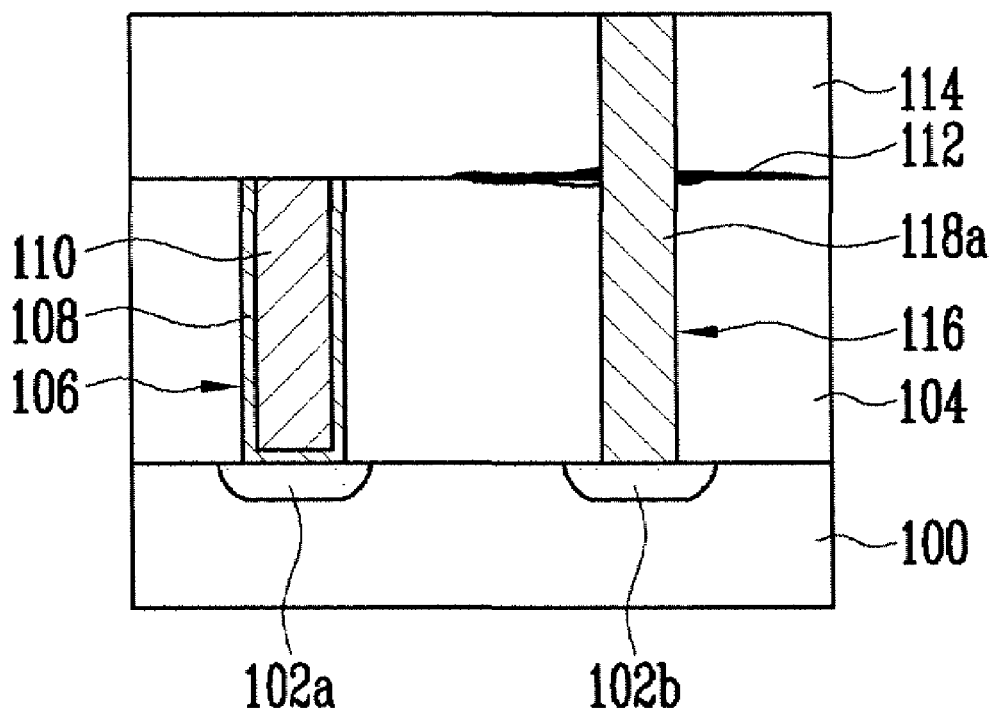

Referring to FIG. 1D, the conductive film 118 may be etched until the surface of the second interlayer insulating film 114 is exposed. The etch process may be performed using, for example, a polishing etch process such as a CMP process. Accordingly, the conductive film 118 remains only within the second contact hole 116, thereby forming a contact plug 118a. The contact plug 118a may become, for example, a drain contact plug.

However, if the formation process of the contact plug 118a is completed in this state, a bridge may be generated since the drain contact plugs 118a are interconnected due to the conductive residue layer 112, which is generated in the CMP process for forming the source contact plug 110. A bridge may also be generated since the drain contact plugs 118a are interconnected through the open path generated at the interface of the first interlayer insulating film 104 and the second interlayer insulating film 114. Therefore, a subsequent process may be performed to prevent the bridge.

Figure 1E:
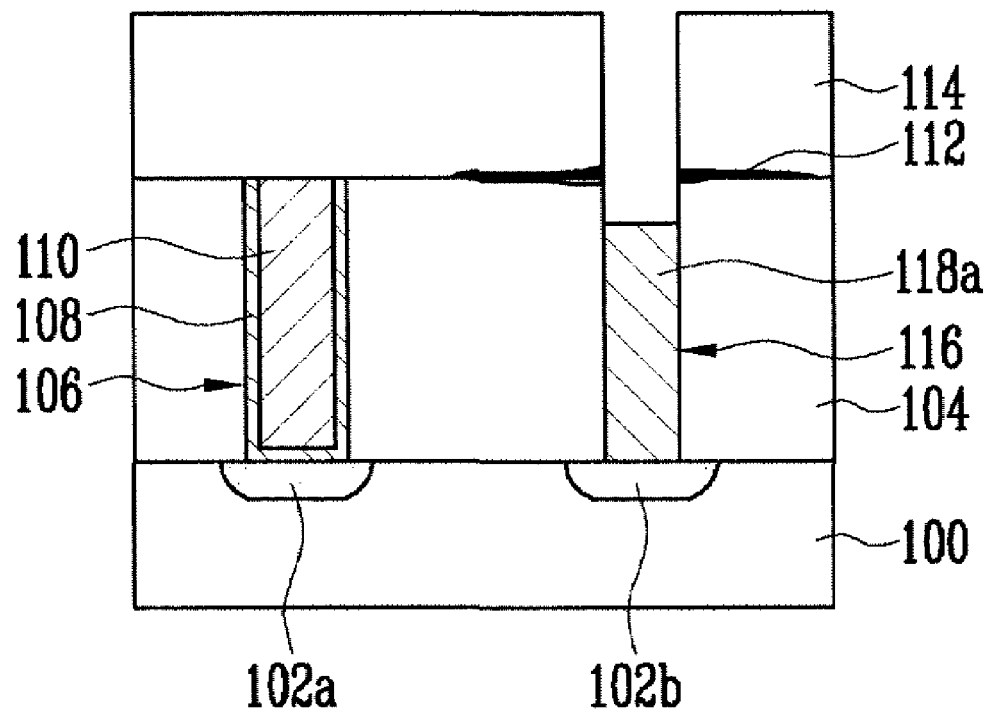

Referring to FIG. 1E, the drain contact plug 118a may be etched to a predetermined thickness in such a manner that the drain contact plug 118a within the second contact hole 116 is lower than the interface of the first and second interlayer insulating films 104, 114. The etch process may be performed using, for example, a dry etch process or, preferably, an etchback process.

The etch process may be performed using, for example, an etch recipe having a higher etch selectivity than that of the first and second interlayer insulating films 104, 114, with respect to the drain contact plug 118a. The first and second interlayer insulating films 104, 114 may be formed using, for example, an oxide film. The drain contact plug 118a may be formed using, for example, a polysilicon film. Accordingly, in this example, the etch process is performed using an etch recipe having a higher etch selectivity than that of the oxide film with respect to the polysilicon film.

The etch process may be performed using, for example, a fluorine (F)-based gas, such as, sulfur hexafluoride ($SF_6$), nitrogen trifluroride ($NF_3$), or carbon tetrafluoride ($CF_4$), and chlorine ($Cl_2$) gas in a dry etch equipment of a High Density Plasma (HDP) method, such as, TCP, ICP, or MERIE.

At this time, the etch process may be performed by setting a target etch thickness thicker than a thickness of the second interlayer insulating film 114. The drain contact plug 118a may, therefore, be formed lower than the interface of the first and second interlayer insulting films 104, 114. Preferably, the etch process of the drain contact plug 118a may be performed by setting the target etch thickness to approximately 3100 to 4100 angstroms.

A part of the drain contact plug 118a may be selectively etched to partially expose the sidewalls of the second interlayer insulating film 114 and the sidewalls of the first interlayer insulating film 104. Thus, the drain contact plug 118a may be formed lower than not only the interface of the first and second interlayer insulating films 104, 114, but also the surface of the conductive residue layer 112. The drain contact plug 118a may be formed at approximately 100 to 2000 angstroms from the interface of the first and second interlayer insulation films 104, 114.

If the drain contact plug 118a is formed as described above, the drain contact plugs 118a that are adjacent to each other are not interconnected although the conductive residue layer 112 generated in the CMP process for forming the source contact plug 110 remains. Accordingly, a bridge between the neighboring drain contact plugs 118a can be prevented.

Further, although the open path is formed at the interface of the first interlayer insulating film 104 and the second interlayer insulating film 114 due to etch damage upon formation of the drain contact hole 116, the conductive film may be formed on the open path so that neighboring drain contact plugs 118a are not interconnected. Accordingly, a bridge between the drain contact plugs 118a can be prevented and, therefore, a process yield and reliability of a device can be improved.

Figure 1F:
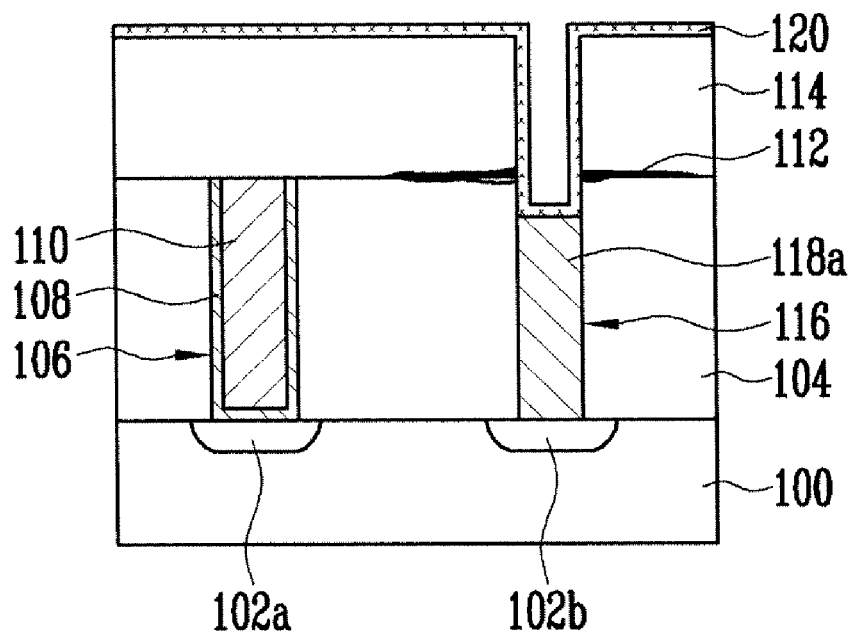

Referring to FIG. 1F, an insulating film 120 for a spacer 120a may be formed on the second interlayer insulating film 114, including the drain contact plug 118a. The insulating film 120 may be formed using, for example, a nitride film, an oxide film, or, preferably, silicon nitride ($Si_3N_4$) or silicon oxide ($SiO_2$). The insulating film 120 may be formed to a thickness of approximately 50 to 130 angstroms.

Figure 1G:
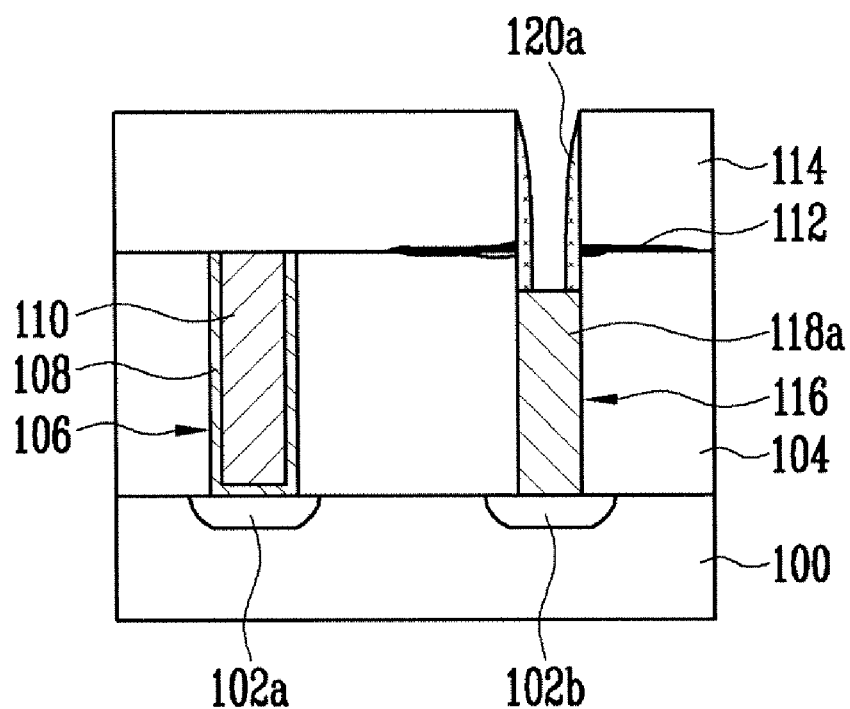

Referring to FIG. 1G, a spacer etch process may be performed using, for example, anisotropic etching in a dry etch equipment of a Capacitively Coupled Plasma (CCP) type. A horizontal portion of the insulating film 120 may be removed, while a vertical portion of the insulating film 120, which is thicker than the horizontal portion, remains. Consequently, a spacer 120*a* may be formed over the drain contact plug 118*a*, on the sidewalls of the first and second insulating films 104, 114 and the conductive residue layer 112.

If the spacer 120*a* is formed as described above, failure due to the conductive residue layer 112 and the open path can be prevented when a bit line (not shown) connected to the drain contact plug 118*a* is formed in a subsequent process. Accordingly, process yield and reliability of a device can be improved.

Although the foregoing description has been made with reference to specific embodiments, it is to be understood that changes and modifications of the present invention may be made by one of ordinary skill in the art without departing from the spirit and scope of the present invention and appended claims.

What is claimed is:

1. A method of fabricating a flash memory device, comprising the steps of:
    forming a first interlayer insulating film on a semiconductor substrate, said semiconductor substrate having a cell region;
    etching the first interlayer insulating film to form a first contact hole that exposes a first junction region of the cell region;
    forming a first contact plug within the first contact hole;
    forming a second interlayer insulating film on the first interlayer insulating film;
    etching the second and first interlayer insulating films to form a second contact hole that exposes a second junction region of the cell region;
    forming a second contact plug within the second contact hole, the second contact plug having a height lower than that of an interface of the first and second interlayer insulating films; and
    forming a spacer on sidewalls of the second contact hole over the second contact plug, wherein the spacer prevents residuals that remain between the first interlayer insulating film and the second interlayer insulating film from connecting to a bit line that will be formed by a subsequent process.

2. The method of claim 1, wherein the formation of the second contact plug comprises:
    forming a conductive film on the second interlayer insulating film, including the second contact hole, so that the second contact hole is gap filled;
    etching the conductive film until the second interlayer insulating film is exposed; and
    etching the conductive film so that the conductive film becomes lower then the interface of the first and second interlayer insulating films.

3. The method of claim 2, wherein the conductive film is a polysilicon film.

4. The method of claim 2, wherein the step of etching the conductive film comprises setting a target etch thickness thicker than a thickness of the second interlayer insulating film, so that the conductive film is lower than the interface of the first and second interlayer insulating films.

5. The method of claim 4, wherein the thickness of the second interlayer insulating film is approximately 2000 to 3000 angstroms.

6. The method of claim 4, wherein the target etch thickness is approximately 3100 to 4000 angstroms.

7. The method of claim 4, wherein the step of etching the conductive film is performed using a fluorine (F)-based gas and a chlorine ($Cl_2$) gas in a dry etch equipment of a High Density Plasma (HDP) method.

8. The method of claim 7, wherein the fluorine (F)-based gas is selected from the group consisting of sulfur hexafluoride ($SF_6$), nitrogen trifluroride ($NF_3$), and carbon tetrafluoride ($CF_4$).

9. The method of claim 1, wherein the step of forming a spacer comprises
    forming an insulating film over the second interlayer insulating film, including the second contact plug;
    etching the insulating film to form the spacer, wherein the insulating film is etched so that a horizontal portion of the insulating film is removed and a vertical portion of the insulating film is not removed.

10. The method of claim 1, wherein the spacer is formed using a nitride film or an oxide film.

11. The method of claim 1, wherein the spacer is formed using silicon nitride ($Si_3N_4$) or silicon oxide ($SiO_2$).

12. The method of claim 1, wherein the spacer is formed to a thickness of approximately 50 to 130 angstroms.

13. The method of claim 1, wherein the spacer is formed using an anisotropic etch process in a dry etch equipment of a Capacitively Coupled Plasma (CCP) type.

* * * * *